United States Patent [19]

Ono et al.

[11] 4,451,805
[45] May 29, 1984

[54] SURFACE ACOUSTIC WAVE FILTER

[75] Inventors: Masaaki Ono; Yoshiro Fujiwara; Masanobu Yanagisawa, all of Kawasaki, Japan

[73] Assignee: Fujitsu Limited, Kawasaki, Japan

[21] Appl. No.: 371,502

[22] Filed: Apr. 23, 1982

[30] Foreign Application Priority Data

Apr. 28, 1981 [JP] Japan .............................. 56-60654[U]

[51] Int. Cl.³ .......................... H03H 9/76; H03H 9/64; H03H 9/145
[52] U.S. Cl. ................................ 333/195; 310/313 D; 333/153; 333/196
[58] Field of Search ................................ 333/150–155, 333/193–196; 310/313 R, 313 A, 313 C, 313 D; 357/30

[56] References Cited

U.S. PATENT DOCUMENTS 3,446,974 5/1969 Seiwatz.
3,706,055 12/1972 Dieulesaint et al. ........ 310/313 B X
3,911,381 10/1975 Brooks et al. ........................ 333/195

FOREIGN PATENT DOCUMENTS 2239810 2/1975 France.

OTHER PUBLICATIONS

Crowley et al., "Acoustoelectrically Controlled Saw Divider", 1977 Ultrasonics Symposium Proceedings, IEEE Cat. 77CH1264-1SU, Oct. 1977, Phoenix, Az.; pp. 633–636.
Patent Abstracts of Japan, vol. 2, No. 58, Apr. 26, 1978, p. 1675.
Patent Abstracts of Japan, vol. 2, No. 55, Apr. 21, 1978, p. 1303.

Primary Examiner—Marvin L. Nussbaum
Attorney, Agent, or Firm—Staas & Halsey

[57] ABSTRACT

A surface acoustic wave filter which comprises a substrate of piezoelectric material and a multistrip coupler. The multistrip coupler comprises a plurality of parallel conductive strips formed on the substrate; at least one input transducer is disposed on one side of the multistrip coupler, and at least one output transducer is disposed on the other side of the multistrip coupler. The surface acoustic wave filter is characterized in that a part of the middle portion of each of the conductive strips of the multistrip coupler is made of a photoconductive material.

17 Claims, 11 Drawing Figures

SURFACE ACOUSTIC WAVE FILTER

BACKGROUND OF THE INVENTION

The present invention relates to improvements in a surface acoustic wave filter.

Surface acoustic wave filters have been used in recent years as small-sized filters for waves of ultra-high frequencies. A prior art surface acoustic wave filter is illustrated in FIG. 1. This surface acoustic wave filter comprises: a substrate 1 of a piezoelectric material such as lithium niobate ($LiNbO_3$) or lithium tantalate ($LiTaO_3$); a multistrip coupler 2 comprising a plurality of parallel conductive strips formed on the substrate; an input transducer 3 disposed on one side of the multistrip coupler 2; and two output transducers 4 and 5 disposed on the other side of the multistrip coupler 2. Electric wave signals introduced from a source 6 to the input transducer 3 are converted to surface acoustic wave signals and transmitted to the output transducers 4 and 5 through the multistrip coupler 2. The transmitted surface acoustic wave signals are reconverted to electric wave signals by each of the output transducers 4 and 5 and transmitted to output terminals 7. Each of the input and output transducers 3, 4, 5 has a filtering characteristic which is determined by the shape of the electrodes thereof. Only signals of a frequency corresponding to the filtering characteristic can pass through each transducer when changing from electric signals to acoustic wave signals, or vice versa. Input power from the input transducer 3 is distributed to the output transducers 4 and 5 by the multistrip coupler 2. The distribution ratio changes cyclically in accordance with the change of the number of conductive strips of the multistrip coupler 2, as shown in FIG. 2. In the graph of FIG. 2, the abscissa represents the number of strips of the multistrip coupler and the ordinate represents the output power of each output transducer. The solid line $P_1$ represents the output power of the output transducer 4. The dotted line $P_2$ represents the output power of the other output transducer 5.

The number of strips of the multistrip coupler 2 cannot be changed after the multistrip coupler 2 is once formed on the substrate. Therefore, the distribution ratio of the input power to the two output transducers 4 and 5 is nonadjustable in the multistrip coupler of the surface acoustic wave filter of the prior art.

SUMMARY OF THE INVENTION

The present invention was made in order to eliminate the above-mentioned disadvantage. An object of this invention is to provide a multistrip coupler for controlling the distribution of signal power transmitted to selected output transducers. Another object of the invention is to provide a portion of each of the conductive strips of the multistrip coupler with a photoconductive material.

A surface acoustic wave filter according to the present invention comprises: a substrate of piezoelectric material; a multistrip coupler comprising a plurality of parallel conductive strips formed on the substrate; at least one input transducer disposed on one side of the multistrip coupler, and at least one output transducer disposed on the other side of the multistrip coupler. The surface acoustic wave filter of the present invention is characterized in that a part of the middle portion of each of the conductive strips of the multistrip coupler is made of a photoconductive material.

DESCRIPTION OF THE PREFERRED EMBODIMENTS

Figure 1:
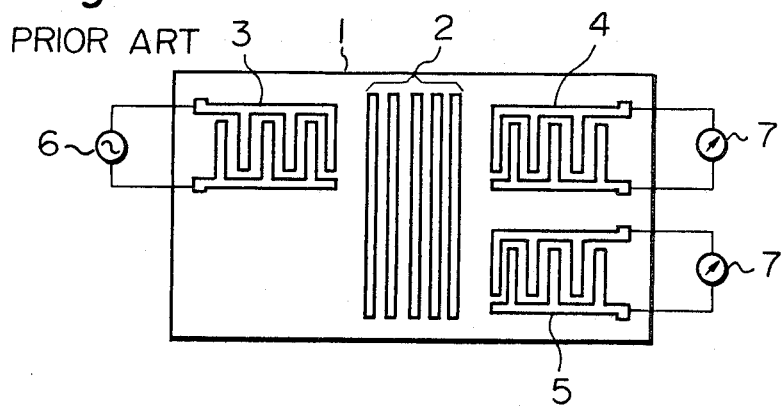
FIG. 1 is a plan view of a prior art surface acoustic wave filter.
Figure 2:
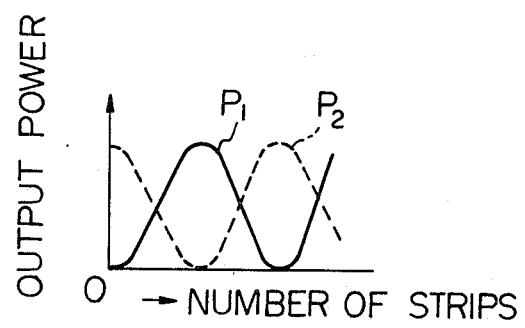
FIG. 2 is a graph of the power distribution to the two output transducers through the multistrip coupler.
Figure 3:
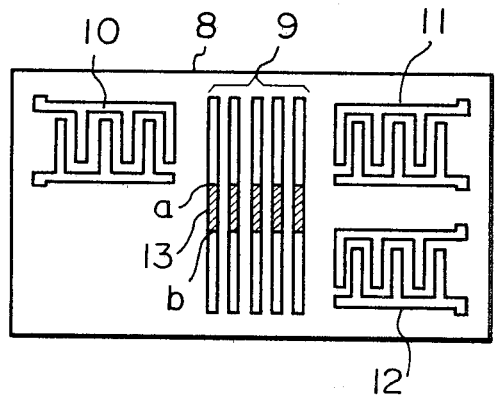
FIG. 3 is a plan view of a surface acoustic wave filter of the present invention.
Figure 4:
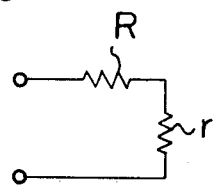
FIG. 4 is an equivalent circuit diagram of the multistrip coupler of the surface acoustic wave filter of FIG. 3.

An embodiment of the present invention is illustrated in FIG. 3. The surface acoustic wave filter illustrated in FIG. 3 comprises a substrate 8 of a piezoelectric material, a multistrip coupler 9, an input transducer 10 disposed on one side of the multistrip coupler 9, and two output transducers 11 and 12 disposed on the other side of the multistrip coupler 9. The central hatched portion 13 of each conductive strip of the multistrip coupler 9 is made of a photoconductive material such as cadmium-selenium (CdSe). The photoconductive portion 13 serves as a conductor when it is lighted and serves as an insulator when it is not lighted. The relation between the resistance Rl of the photoconductive portion 13 in the light and the resistance Rd of the photoconductive portion 13 in the dark is $Rl << Rd$. An equivalent circuit diagram of the multistrip coupler is illustrated in FIG. 4. R represents the resistance of the photoconductive portion, and r represents the impedance of the multistrip coupler, in which $Rl << r << Rd$ ($Rl \approx 0$). When the photoconductive portion 13 is lighted, ends a, b are short-circuited, allowing signals to be transmitted through the photoconductive portion 13. When the photoconductive portion 13 is not lighted, ends a, b are insulated from each other, preventing signals from being transmitted through the photoconductive portion 13. Thus, the effective number of strips of the multistrip coupler can be changed by changing the number of strips lighted. Therefore, distribution of signal power transmitted to the output tranducers 11 and 12 can be controlled.

As mentioned above, the surface acoustic wave filter according to the present invention comprises a multistrip coupler having strips, each of which has a photoconductive portion. Therefore it is possible to change and adjust the distribution of signal power transmitted to the output tranducers. Also, it is possible to enlarge the field of application of the surface acoustic wave filter.

In using the surface acoustic wave filter of the present invention, the desired amount of signal can be transmitted to each of the output transducers by selectively lighting the strips of the multistrip coupler.

Figure 5:
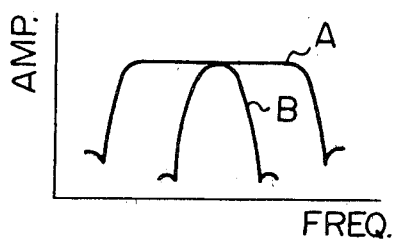
FIG. 5 is a graph of the filtering characteristics of bands of different widths to be filtered.

The photoconductive portions of the surface acoustic wave filter of the present invention can be used as a switch for selecting output transducers thereof by lighting all the photoconductive portions simultaneously. In this case, the number of strips of the multistrip coupler is preset so that all of the signal power from the input transducer 10 is transmitted to the output transducer 12 when all of the photoconductive portions are lighted, while all of the signal power from the input transducer 10 is transmitted to the other output transducer 11 when none of the photoconductive portions are lighted. When the photoconductive portions are used as a selection switch, as mentioned above, the output transducers 11 and 12 may have different filtering characteristics A and B, respectively, as illustrated in FIG. 5. The characteristic A has a wider filtering band than the characteristic B. In use, signals from the input transducer 10 are first transmitted to the output transducer 11 which passes A wide range of signals for rough signal treatment. Then, the photoconductive portions 13 are lighted to change the effective output transducer from 11 to 12 which passes a narrow range of signals for precise signal adjustment.

Figure 6:
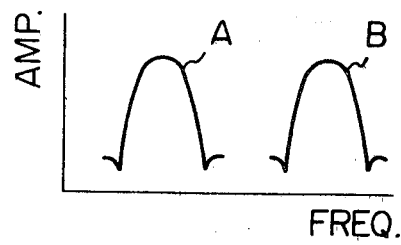
FIG. 6 is a graph of the filtering characteristics of different frequencies to be filtered.

The output transducers 11 and 12 may also have completely different filtering characteristics A and B, respectively, as illustrated in FIG. 6, so that of the output transducers 11, 12 passes a different frequency band of signals. In this case, the photoconductive portions are used as a switch for changing the signal channel.

The surface acoustic wave filter may comprise only one output transducer 12. In this case, the entire group of the photoconductive portions 13 is used as a switch for turning on or off the output transducer 12.

Figure 7:
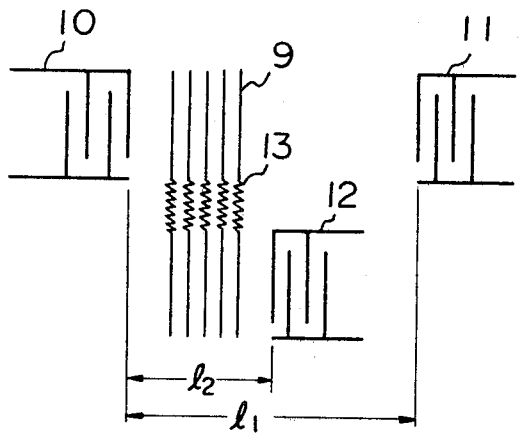
FIG. 7 is a plan view of a second embodiment of the present invention.
Figure 8:
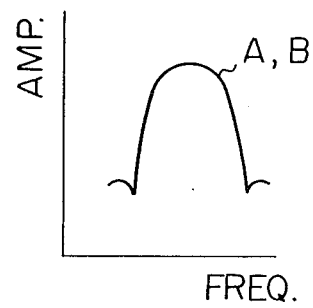
FIG. 8 is a graph of the filtering characteristics of the output transducers illustrated in FIG. 7.
Figure 9:
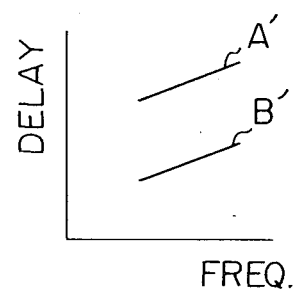
FIG. 9 is a graph of the delay characteristics of the output transducers illustrated in FIG. 7.

Another embodiment of the present invention is illustrated in FIG. 7. Horizontal distances $l_1$ and $l_2$ in the drawing between the input transducer 10 and the output transducers 11 and 12 differ from each other. The transmission time of signals from the input transducer 10 to the output transducer 11 is more than the transmission time from the input transducer 10 to the output transducer 12, as can be seen from FIG. 9, which illustrates the delay characteristics A', B', of the output transducers 11 and 12. In this case, both output transducers 11 and 12 may have the same filtering characteristic A, B, as illustrated in FIG. 8. On of the output transducers 11 or 12 can be selectively used by lighting or not lighting the photoconductive portions 13.

Figure 10:
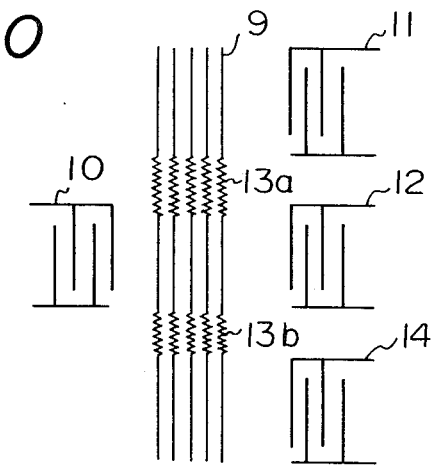
FIG. 10 is a plan view of a third embodiment of the present invention.
Figure 11:
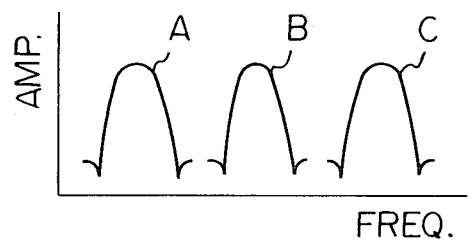
FIG. 11 is a graph of the filtering characteristics of the output transducers illustrated in FIG. 10.

A further embodiment of the present invention is illustrated in FIG. 10. Three output transducers 11, 12 and 14 are disposed side by side facing the multistrip coupler 9. The output transducers 11, 12 and 14 have different filtering characteristics A, B and C, respectively, as illustrated in FIG. 11. Two portions 13a and 13b of each strip of the multistrip coupler 9 are made of a photoconductive material. The photoconductive portions 13a and 13b are located at the positions which correspond to the spaces between two adjacent output transducers. The output tranducer 11 can be selected by lighting the portions 13a and not lighting the portion 13b. The output transducer 12 can be selected by not lighting the portions 13a and 13b. The output transducer 14 can be selected by not lighting the portions 13a and lighting the portions 13b.

The many features and advantages of the above invention are apparent from the detailed specification and thus it is intended by the appended claims to cover all such features and advantages of the system which fall within the true spirit and scope of the invention. It is not desired to limit the invention as shown and described in the above specification. Further, since numerous modifications and changes will readily occur to those skilled in the art, it is not desired to limit the invention to the exact construction and operation shown and described, and accordingly all suitable modifications and equivalents may be regarded as falling within the scope of the invention.

We claim:

1. A surface acoustic wave filter comprising:
   a substrate of a piezoelectric material;
   a multistrip coupler, formed on said substrate and having first and second sides, comprising a plurality of parallel conductive strips each of which has a middle portion made of a photoconductive material;
   at least one input transducer formed on said first side of said multistrip coupler; and
   at least one output transducer formed on said second side of said multistrip coupler.

2. A surface acoustic wave filter according to claim 1, wherein the number of said output transducers is one.

3. A surface acoustic wave filter according to claim 1, wherein the number of said output transducers is at least two.

4. A surface acoustic wave filter according to claim 3, wherein said photoconductive portion of said parallel conductive strips of said multistrip coupler is located at a position opposite the space between two adjacent output transducers.

5. A surface acoustic wave filter according to claim 3, in which said photoconductive material is cadmium-selenium.

6. A surface acoustic wave filter according to claim 3, wherein at least one of said output transducers is formed on said substrate at a distance from said multistrip coupler different from the distance of other said output transducers.

7. A surface acoustic wave filter according to claim 3, wherein each of said output transducers has a filtering characteristic of a different width filtering band.

8. A surface acoustic wave filter according to claim 3, wherein each of said output transducers has a filtering characteristic of a different filtering frequency.

9. A surface acoustic wave filter according to claim 3, wherein at least three of said output transducers are formed side by side facing said multistrip coupler and wherein each of said conductive strips of said multistrip coupler has two portions made of said photoconductive material located at positions opposite the spaces between at least two adjacent said output transducers.

10. A surface acoustic wave filter operatively connected to receive and input electric wave signal, comprising:
    a substrate;
    an input transducer, formed on said substrate, for receiving an input electric wave signal and for converting the input electric wave signal to an input surface acoustic wave signal;
    switching means, formed on said substrate next to said input transducer, for receiving said input surface acoustic wave signal and for selectively transmitting first and second surface acoustic wave signals, said switching means comprising parallel conductive strips each of which has a photoconductive portion; and first and second output transducers, formed on said substrate substantially parallel to said parallel conductive strips and defining a first space therebetween, for respectively receiving said first and second surface acoustic wave signals and for converting said first and second surface acoustic wave signals to first and second electric wave signals, respectively, the position of each of said photoconductive portions on said parallel conductive strips being located opposite said first space such that a line perpendicular to each of said photoconductive portions intersects said first space.

11. A surface acoustic wave filter according to claim 10, wherein said photoconductive portions comprise cadmium selenium.

12. A surface acoustic wave filter according to claim 10, wherein the distance between said switching means and said first output transducer is greater than the distance between said switching means and said second output transducer.

13. A surface acoustic wave filter according to claim 10, wherein said first photoconductive portions operate as a switch for selectively transmitting said first and second surface acoustic wave signals to said first and second output transducers.

14. A surface acoustic wave filter operatively connected to receive an input electric wave signal, comprising:

a substrate;

an input transducer, formed on said substrate, for receiving the input electric wave signal and for converting the input electric wave signal to an input surface acoustic wave signal;

switching means, formed on said substrate next to said input transducer, for receiving said input surface acoustic wave signal and for selectively transmitting first and second surface acoustic wave signals, said switching means comprising parallel conductive strips having first and second photoconductive portions; and first, second and third output transducers, formed on said substrate substantially parallel to said parallel conductive strips, for converting said first and second surface acoustic wave signals to first and second electric wave signals, respectively, a first space being defined between said first and second output transducers and a second space being defined between said second and third output transducers, said first photoconductive portions being located opposite said first space such that a line perpendicular to each of said first photoconductive portions intersects said first space, and said second photoconductive portions being located opposite said second space such that a line perpendicular to each of said second photoconductive portions intersects said second space.

15. A surface acoustic wave filter according to claim 14, wherein each of said first and second output transducers passes a different frequency band signal.

16. A surface acoustic wave filter according to claim 14, wherein said first and second output transducers from first and second filters, each having a different filtering characteristic.

17. A method of using a surface acoustic wave filter including a substrate, a multistrip coupler, formed on the substrate, having parallel conductive strips, each of which has a photoconductive portion, and output transducers, comprising the steps of:

(a) converting an input electric wave signal to an input surface acoustic wave signal;

(b) transmitting the input surface acoustic wave signal along the substrate;

(c) the output transducers receiving the input surface acoustic wave signal;

(d) selectively eliminating the photoconductive portions of the parallel photoconductive strips so as to divide the input surface acoustic wave signal into first and second surface acoustic wave signals; and (e) converting the first and second surface acoustic wave signals to first and second electric wave signals.

* * * * *

UNITED STATES PATENT AND TRADEMARK OFFICE
CERTIFICATE OF CORRECTION

PATENT NO. : 4,451,805
DATED : MAY 29, 1984
INVENTOR(S) : MASAAKI ONO ET AL.

It is certified that error appears in the above-identified patent and that said Letters Patent is hereby corrected as shown below:

Col. 3, line 23, "A" should be --a--;
       line 30, after "that" insert --each--.

Col. 5, line 18, after "said" insert --first--.

Col. 6, line 24, "from" should be --form--.

Signed and Sealed this

Fifth Day of March 1985

[SEAL]

Attest:

DONALD J. QUIGG

Attesting Officer     Acting Commissioner of Patents and Trademarks